Feb. 27, 1951 J. M. HANERT 2,543,629
INDUCTANCE TUNED AUDIO FREQUENCY OSCILLATOR
Filed May 24, 1948
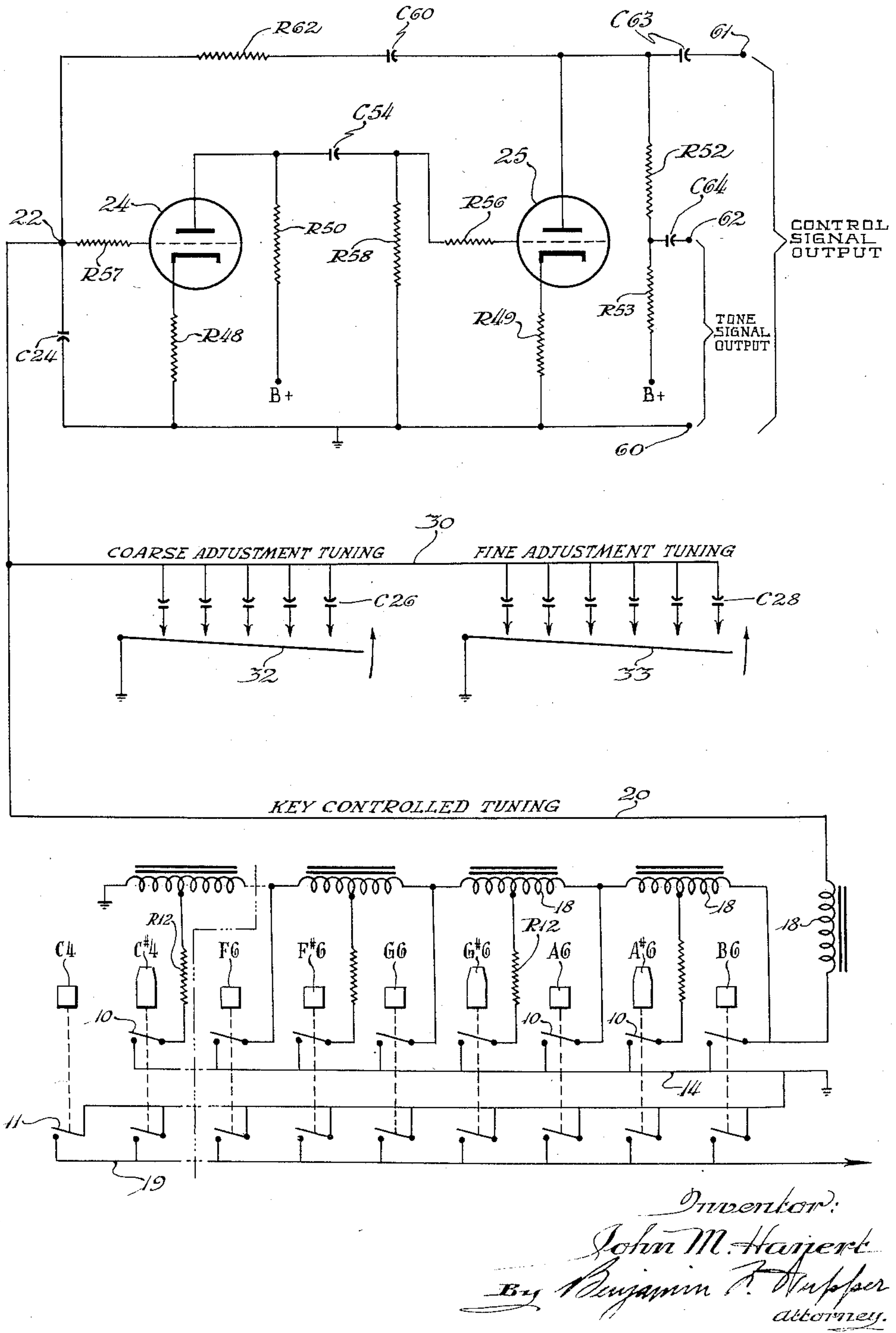
Inventor:
John M. Hanert
By Benjamin T. Hupper
Attorney.

Patented Feb. 27, 1951 2,543,629

UNITED STATES PATENT OFFICE 2,543,629

INDUCTANCE TUNED AUDIO-FREQUENCY OSCILLATOR

John M. Hanert, Park Ridge, Ill., assignor to Hammond Instrument Company, Chicago, Ill., a corporation of Delaware Application May 24, 1948, Serial No. 28,857

2 Claims. (Cl. 84—1.01)

My invention relates generally to inductance tuned audio frequency oscillators, and more particularly to an improved oscillator of this character requiring a reduced number of inductance coils, and which is readily adaptable for use as a generator in a melody type electrical musical instrument.

In prior electrical musical instruments of the melody type such for example that shown in the patent to Hammond et al. 2,233,258, an oscillator is tuned by selectively connecting different capacitances in an inductance-capacitance oscillator tuning circuit so as to change the resonant frequency thereof and thus tune the oscillator to the required frequency. In such oscillators the range through which the frequency of the oscillator may conveniently be tuned is relatively limited because of the fact that the sizes of capacitors required in order to make the oscillator tunable throughout a wide range, such for example three octaves, becomes a manufacturing problem, as well as unduly increasing the cost of the instrument.

To obviate this difficulty, in the instrument of the above mentioned patent, the oscillator is tuned by capacitors through a range of but 12 semitones, and, in order to obtain frequencies below the range of the oscillator, the output of the oscillator is supplied to a cascaded series of frequency divider stages. In this type of instrument the oscillator is tuned to the same frequency upon the depression of corresponding keys in the several octaves of the keyboard, and it is therefore necessary to provide additional means such as a relay mechanism for selecting the particular divider stage from which the signal is to be taken dependent upon the particular octave in which the depressed key is located. The necessity of utilizing relays or similar octave selecting means introduces complications in the instrument and increases its cost of manufacture.

In accordance with the principles of the present invention the necessity of providing such octave selecting means is avoided, principally by virtue of the provision of an oscillator which may readily be tuned by the depression of the playing keys through a range of at least three octaves, for example, from the frequency 523.225 of the note C4 to the frequency 3951.07 of the note B6. The oscillator is of unique construction in that while it is of the inductance-capacitance tuned type, the capacitance in the tuning circuit is maintained constant after initially tuning the instrument, whereas the inductance of the resonant circuit is changed by the depression of keys. This inductance comprises a plurality of individual coils connected in series, one coil for each pair of successive notes, with provisions for connecting the junctions of these coils to ground by alternate playing key operated switches and connecting taps on the coils to ground through resistors. Thus, in an instrument of this type, there would be 19 individual coils separated sufficiently in space so as to have very little mutual reaction and arranged so that depression of the highest note of the keyboard connects one of these coils in the tuning circuit, depression of the second highest key connects a portion of the second coil, and the third key connects all of the second coil in the tuning circuit, etc. The oscillator will then operate at the frequency of the highest of a plurality of simultaneously depressed keys. This is the case particularly because the key operated switches connect the junctions between the series of coils or taps on the coils to ground and thus if several keys are simultaneously depressed, those coils or part coils connected between the switches of the highest and lowest depressed keys have their terminals connected to ground. When a part only of a coil is connected in the tuning circuit by a key operated switch the connection of the tap on the coil to ground is through a resistor of such value that it compensates for the change in inductive impedance, as will be more fully described hereinafter.

The tuning of the oscillator by successive addition in the tuning circuit of series inductance coils or parts thereof, as the frequency of the oscillator is to be decreased has the further advantage that the inductances of the coils may readily be changed in slight increments merely by moving one of the laminations in the core, or by moving the coil relative to the core laminations about which it is wound. This is a much simpler method of securing a desired inductance value than the method of selecting capacitors of desired value as was required in the instrument shown in the above mentioned Patent No. 2,233,258. Due to unavoidable variations in the capacitance of capacitors, it was necessary in the manufacture of the instrument disclosed in said patent (wherein the oscillator was tuned by changing the number of capacitors in series in the resonant circuit of the oscillator) to have available a large number of capacitors of slightly different values, and to select from this large number of capacitors a "matched" group for a particular instrument. The reason for this was, of course, that if the first capacitor of the series in the tuning circuit varies from its nominal value by a small fractional percent, the next capacitor in the series should, if possible, vary from its nominal value by the same fractional per-cent but of the opposite sign. The purpose of this is to avoid accumulation of deviations from the nominal capacitances. Furthermore, capacitors are subject to slight variations in capacitance, upon changes in temperature and humidity, and due to aging. Such changes inevitably have an effect upon the tuning of the instrument. On the other hand the inductance of a coil does not noticeably change with the changes of humidity and temperature normally encountered, and does not change measurably with age.

It is therefore a primary object of my invention to provide an improved oscillator for an electrical musical instrument of the melody type which is tuned to the required note frequency under the control of playing keys, alternate keys respectively connecting in series in the oscillator tuning circuit a plurality of individual inductance coils, the intermediate keys connecting additional portions of one of the inductance coils in the tuning circuit.

A further object is to provide an improved oscillator of high stability in which the output signal is of symmetrical square wave shape.

A further object is to provide an improved stable oscillator for electrical musical instruments of the melody type which is simple in construction and the cost of which is low.

Other objects will appear from the following description, reference being had to the accompanying drawing, which is a schematic wiring and block diagram of substantially the complete instrument.

The improved oscillator is disclosed herein as forming part of an electrical musical instrument comprising a keyboard, which may be of the type shown in the aforesaid Patent 2,233,258 as well as shown in Hammond Patent 2,233,569. The keyboard includes three octaves of keys C4 to B6, of which nine representative keys are illustrated, the keys bearing reference characters corresponding to their pitch designations. Each of the keys (except key C4) operated a single pole single throw switch 10. The fixed poles of switches 10 are connected to a grounded bus 14. A plurality of tuning coils 18 are provided, these coils being connected in series and having the junctions between successive coils connected respectively to the movable poles of the alternate switches 10. The intermediate switches 10 are connected respectively to taps on the coils 18 through resistors R12. The last coil 18 of the series has its terminal connected to ground. In addition each key operates a switch 11 to connect a conductor 19 to ground, thereby to render the output amplifier effective to transmit the signal produced by the oscillator.

It is important that there be a minimum of linking of the magnetic flux produced by the several coils, that is, there shall be a minimum of mutual reaction. To accomplish this purpose the coils 18 are not arranged in a sequential row but are preferably interspersed so that the possibility of mutual reaction is reduced to a minimum. This may be accomplished in any convenient manner as set forth, for example, in my copending application Serial No. 51,409, filed September 27, 1948, which is a continuation in part of application Serial No. 753,994, filed June 11, 1947. Application Serial No. 753,994 has since been abandoned.

By interspersing the coils they may be placed relatively close together without appreciably changing the inductance of the whole circuit.

It will thus appear that upon depression of any of the playing keys one or more of the inductance coils 18 with or without an additional part of a coil, is or are connected in series between the grounded bus 14 and a conductor 20 which leads to a junction point 22, the latter being also connected to the grid of a triode 24 which together with a triode 25 and their associated circuit elements constitute the oscillator. A fixed capacitor C24 is connected between the junction point 22 and ground, this capacitor forming the main capacitance of the resonant circuit of the oscillator, which circuit includes one or more of the complete inductance coils 18 with or without a part of a coil 18. To tune the oscillator initially to the desired frequency, there are provided a plurality of coarse tuning capacitors C26 and a plurality of fine tuning capacitors C28, each having one terminal connected to the junction 22 by a conductor 30, the coarse tuning capacitors C26 being adapted to have their other terminals successively connected to ground by a suitable switching means indicated as a grounded flexible member 32 which may be brought successively into contact with the other terminals of the capacitors C26. A similar flexible member 33 is indicated as a means for adjustably connecting capacitors C28 to ground. The coarse tuning capacitors C26 may be of such values that, as they are successively connected in the tuning circuit, the pitch at which the oscillator operates will change by about two semitones, whereas the fine tuning capacitors C28 are of such values that, as they are successively connected in the tuning circuit, the pitch of the oscillator will change by ⅕ of a semitone.

The oscillator, as previously indicated, comprises triodes 24, 25 which may be in a single envelope. The cathodes of the triodes 24 and 25 are connected to ground through self-bias resistors R48 and R49. The anode of triode 24 is connected to a suitable source of current indicated as a +B terminal through a load resistor R50, while the anode of triode 25 is connected to a +B terminal through voltage divider resistors R52 and R53 which together form a load for the triode 25. The anode of triode 24 is connected to the grid of triode 25 through a blocking capacitor C54 and a series grid resistor R56, the junction between C54 and R56 being connected to ground through a grid return resistor R58. The anode of triode 25 is connected to the grid of triode 24 through a capacitor C60, a resistor R62 and a series grid resistor R57, to provide a feedback path. This oscillator, due in part to the provision of the series grid resistors R56 and R57, produces an output wave on the anode of triode 25 which is substantially square. A wave of this character consists substantially exclusively of a fundamental with a long series of its odd harmonics.

In operation the oscillator functions in a non-linear manner and thus rectangular wave signals will appear across its output terminals 60—61 and 60—62. The terminal 60 is connected to ground while the terminal 61 is connected to the anode of triode 25 through a blocking capacitor C63. The terminal 62 is connected to the junction of the voltage divider plate load resistors R52 and R53, through a capacitor C64. The output terminals 60—61 may be connected to a frequency dividing system, to provide a control signal thereto, while the terminals 60—62 may be connected to the output system of the instrument to provide the tone signal for the three highest octaves.

From the player's standpoint, it is important that a solo musical instrument have the property that depression of a plurality of keys within the span of the player's hand result in sounding either the highest or lowest note at the correct pitch. In my aforesaid copending application, Serial No. 51,409, there appears a more complete description of how the oscillator operates when the junction points between coils are connected to ground. When a plurality of keys are simultaneously depressed (for example, as when playing the instrument in a legato manner) the total series inductance effective in the oscillating circuit is measured between the switch of the highest of the depressed keys and the junction point 22. Further connections effected by the depression of any lower keys has no effect because a positive ground connection has already been established by the highest of the depressed keys.

Consider now the case when the A#6 key is depressed. The tap on the coil 18 associated with the A#6 key is selected to be at approximately 60% of the turns from the grid end of the coil. The total series inductance is then correct for playing the A#6 note. When the A6 key is also depressed, the lower end of the coil is connected directly to ground. Inasmuch as there is a resistor R12 in series with the A#6 key switch, the over-all series tuning inductance tends to be increased by depression of the A6 key and therefore the oscillator frequency tends to be lower on this account. However, a secondary factor is introduced when both the A#6 and A6 keys are depressed. This second factor is that the R12 resistor in series with the A#6 key switch is shunted as a load across the lower portion of the winding of the coil 18 associated with the A6 and A#6 keys, and this resistor reflects itself as a shunt load on the upper half of the coil winding. This shunting effect on the upper half of the coil 18 raises the pitch. By proper selection of the value of the resistor R12, the two effects may be made equal and thus cancel each other, insofar as changes in frequency are concerned. When R12 is properly chosen, the frequency is the same with either the A#6 key held down or both the A#6 and the A6 keys held down. The value of R12 is in the order of 15 ohms (increasing in value down the scale). This amount of resistance in series with the total tuning inductance is inconsequential and neither frequency nor Q are appreciably affected by the inclusion of the resistors R12. When keys lower than the A6 key are depressed simultaneously with the A#6 key the changes in tuning of the A#6 note is inconsequentially small due to the high series impedance offered by other coils 18 and the fact that resistors R12 act as shunt loads on the lower portion of the coil 18 associated with the A#6 key.

The provision of the taps on the coils 18 greatly reduces the manufacturing cost of the tuning coils 18 inasmuch as there are then only half as many tuning coils as playing keys. The resistors R12 may conveniently take the form of resistance wires connecting the tuning contact switch members to the tuning coils 18. This great reduction in the number of tuning coils required does not however result in violating the requirement of the highest note selection when a plurality of keys are simultaneously depressed.

While I have disclosed a particular embodiment of my invention, it will be apparent to those skilled in the art that numerous modifications and variations may be made in the form and construction thereof, without departing from the more fundamental principles of the invention. I therefore desire, by the following claims, to include within the scope of my invention all such similar and modified forms of the apparatus disclosed, by which substantially the results of the invention may be obtained by substantially the same or equivalent means.

I claim:

1. A resonant tuning circuit for a wide range audio frequency oscillator comprising, a capacitor, a plurality of separate inductance coils connected in series to one plate of the capacitor, each of said coils having a tap intermediate its ends, a plurality of manually operated single-pole single-throw switches, said switches being connected respectively to the junctions between the coils and to the taps on the coils and when operated to connect said junctions and taps to the other plate of the capacitor, and a resistor connected in series with each of the taps and its connected switch.

2. A tuning circuit for an audio frequency oscillator for use in keyboard electrical musical instruments of the melody type in which upon depression of more than one key at a time it is desired to tune the oscillator to a pitch which corresponds to the higher of the depressed keys, comprising a plurality of separate inductance elements each having a tap intermediate its ends, conductors connecting the inductance elements in series, switches operable by the keys of the keyboard and respectively connected to the conductors and to the taps in alternation, said switches being operable to connect one or more of the inductance elements with or without a portion of one of these elements in the tuning circuit, and resistors in the circuits completed by the switches which are connected to the taps on the inductance elements, said resistors being of such value that upon contemporaneous closure of switches connected to the same inductance element the inductive effect of the shunted portion of the element is substantially cancelled by the resistor.

JOHN M. HANERT.

REFERENCES CITED

The following references are of record in the file of this patent:

UNITED STATES PATENTS

| Number | Name | Date |
|---|---|---|
| 2,192,205 | Siemens | Mar. 5, 1940 |
| 2,332,076 | Hammond et al. | Oct. 19, 1943 |